(12) United States Patent  
Tanaka et al.

(10) Patent No.: US 7,964,915 B2
(45) Date of Patent: Jun. 21, 2011

(54) SEMICONDUCTOR DEVICE HAVING A DMOS STRUCTURE

(75) Inventors: Shuji Tanaka, Gunma (JP); Shuichi Kikuchi, Gunma (JP); Kiyofumi Nakaya, Saitama (JP); Kazuhiro Yoshitake, Gunma (JP)

(73) Assignee: SANYO Electric Co., Ltd., Osaka (JP)

( * ) Notice: Subject to any disclaimer, the term of this patent is extended or adjusted under 35 U.S.C. 154(b) by 0 days.

(21) Appl. No.: 11/708,682

(22) Filed: Feb. 21, 2007

(65) Prior Publication Data

US 2007/0200195 A1    Aug. 30, 2007

(30) Foreign Application Priority Data

Feb. 24, 2006 (JP) ................................. 2006-048373

(51) Int. Cl.
*H01L 29/76* (2006.01)
*H01L 31/113* (2006.01)
(52) U.S. Cl. ..................................................... 257/341
(58) Field of Classification Search .................. 257/194, 257/492, E29.268, 341, 330–332, 337, E21.427; 438/259, 270
See application file for complete search history.

(56) References Cited

U.S. PATENT DOCUMENTS

| | | | |
|---|---|---|---|
| 4,987,465 A | 1/1991 | Longcor et al. | |
| 5,294,824 A * | 3/1994 | Okada | 257/409 |
| 6,211,552 B1 * | 4/2001 | Efland et al. | 257/343 |
| 6,445,038 B1 | 9/2002 | Tihanyi | |
| 6,693,338 B2 * | 2/2004 | Saitoh et al. | 257/492 |
| 7,576,388 B1 * | 8/2009 | Wilson et al. | 257/330 |
| 2001/0009287 A1 | 7/2001 | Fujihira et al. | |
| 2001/0053581 A1 * | 12/2001 | Mosher et al. | 438/297 |
| 2003/0027396 A1 * | 2/2003 | Imam et al. | 438/306 |

(Continued)

FOREIGN PATENT DOCUMENTS

EP    0 973 205 A    1/2000

(Continued)

OTHER PUBLICATIONS

European Search Report directed to EP Application No. 07 003 778.3, dated Oct. 16, 2008.

(Continued)

*Primary Examiner* — Calvin Lee
(74) *Attorney, Agent, or Firm* — Morrison & Foerster LLP

(57) ABSTRACT

The invention provides a high voltage MOS transistor having a high source/drain breakdown voltage of about 300V and a low on-resistance. An N-type body layer is formed extending from a source layer side to under a gate electrode. A P-type second drift layer is formed in an epitaxial semiconductor layer by being diffused deeper than a first drift layer, extending from under the first drift layer to under the gate electrode and forming a PN junction with the body layer under the gate electrode. A surface of the body layer between this second drift layer and the source layer serves as a channel region. The first drift layer is formed at a distance from a left end of the gate electrode where electric field concentration easily occurs.

11 Claims, 12 Drawing Sheets

U.S. PATENT DOCUMENTS

| | | | |
|---|---|---|---|
| 2004/0108544 A1 | 6/2004 | Hossain et al. | |
| 2005/0104124 A1 | 5/2005 | Iwabuchi | |
| 2005/0230765 A1 | 10/2005 | Ohtake | |
| 2005/0253216 A1 | 11/2005 | Tsuchiko | |
| 2005/0285189 A1 | 12/2005 | Shibib et al. | |
| 2006/0022294 A1 | 2/2006 | Petzold et al. | |
| 2007/0114569 A1* | 5/2007 | Wu et al. | 257/194 |
| 2007/0200171 A1* | 8/2007 | Tanaka et al. | 257/341 |
| 2008/0006818 A1* | 1/2008 | Luo et al. | 257/19 |

FOREIGN PATENT DOCUMENTS

| | | |
|---|---|---|
| JP | 2003-343960 A | 12/2003 |
| JP | 2004-039774 | 2/2004 |

OTHER PUBLICATIONS

Tanaka et al., U.S. Office Action, mailed Aug. 11, 2008, directed to U.S. Appl. No. 11/708,685; 11 pages.

Tanaka et al., U.S. Office Action, mailed Feb. 11, 2009, directed to U.S. Appl. No. 11/708,685; 12 pages.

Tanaka et al., U.S. Office Action, mailed Jun. 23, 2009, directed to U.S. Appl. No. 11/708,685; 13 pages.

European Office Action mailed on Jul. 8, 2009 directed at related application No. 07003778.3-2203; 2 pages.

European Search Report directed to EP Application No. 07 003 779.1, dated Oct. 16, 2008; 4 pages.

* cited by examiner

SEMICONDUCTOR DEVICE HAVING A DMOS STRUCTURE

CROSS-REFERENCE OF THE INVENTION

This invention claims priority from Japanese Patent Application No. 2006-048373, the content of which is incorporated herein by reference in its entirety.

BACKGROUND OF THE INVENTION

1. Field of the Invention

The invention relates to a semiconductor device and a method of manufacturing the same, particularly, to a structure of a DMOS type (Diffused Mos-type) high voltage transistor and a method of manufacturing the same.

2. Description of the Related Art

A high voltage MOS transistor has a high source/drain breakdown voltage or a high gate breakdown voltage and is generally used for various drivers such as an LCD driver, a power supply circuit or the like. In recent years, there has been a need particularly for a high voltage MOS transistor having a high source/drain breakdown voltage Bvds and a low on-resistance.

FIG. 19 shows a structure of a conventional P-channel type high voltage MOS transistor (hereafter, referred to as a conventional HV-PchMOS). An N-type epitaxial semiconductor layer 51 is formed on a P-type single crystal semiconductor substrate 50 by epitaxial growth, and an $N^+$-type embedded semiconductor layer 52 is formed at an interface of the single crystal semiconductor substrate 50 and the epitaxial semiconductor layer 51. A gate electrode 54 is formed on the epitaxial semiconductor layer 51 with a gate insulation film 53 being interposed therebetween. A $P^+$-type source layer (PSD) 55 is formed on the right side of the gate electrode 54, and an N-type well layer (N+W) 56 extends from the source layer 55 side to under the gate electrode 54.

A P-type drift layer 57 is formed on the left side of the gate electrode 54, and the right 25 end of the layer 57 extends under the gate electrode 54. A surface region of the N-type well layer 56 between this drift layer 57 and the source layer 55 serves as a channel region CH1, and the length of this channel region CH1 is an effective channel length Leff1. The drift layer 57 is a region where carriers drift, and also serves to reduce a drain electric field by depletion when a high voltage (in this case, a negative high voltage relative to the source layer 55) is applied to a 30 drain layer 58.

The P-type drain layer 58 is formed on the left side of the drift layer 57, being in contact with this drift layer 57. The drain layer 58 is made of three P-type layers (a PSD layer, a SP+D layer, and a P+D layer), in which the PSD layer on the surface has the highest concentration, the SP+D layer thereunder has the second highest concentration and the P+D layer thereunder has the lowest concentration. Providing the drain layer 58 with such concentration gradient increases the expansion of a depletion layer of the drain layer 58, contributing to realization of a higher voltage MOS transistor.

Furthermore, a first field plate 60 extending from above a portion of the gate electrode 54 onto the drift layer 57 with a first interlayer insulation film 59 being interposed therebetween and a second field plate 62 extending from above a portion of the first field plate 60 onto the drift layer 57 with a second interlayer insulation film 61 being interposed therebetween are formed. The first and second field plates 60 and 62 are set to the same potential as that of the source layer 55. The first and second field plates 60 and 62 serve to expand the depletion layer of the drift layer 57 and reduce the drain electric field. The high voltage MOS transistor is disclosed in the Japanese Patent Application Publication No. 2004-39774.

SUMMARY OF THE INVENTION

While the above described conventional HV-PchMOS achieves a source/drain breakdown voltage Bvds of about 300V, there is a problem that an on-resistance is high. Although it is considered that the HV-PchMOS is modified into a DMOS, the DMOS has a problem that the source/drain breakdown voltage Bvds reduces.

The invention is directed to providing a high voltage MOS transistor having a high source/drain breakdown voltage Bvds of about 300V and a low on-resistance.

The invention provides a semiconductor device including: a semiconductor layer of a first conductivity type; a gate electrode formed on the semiconductor layer with a gate insulation film being interposed therebetween; a source layer of a second conductivity type formed adjacent to one end of the gate electrode; a body layer of a first conductivity type extending from the source layer side to under the gate electrode; a first drift layer of a second conductivity type formed at a distance from an other end of the gate electrode; and a second drift layer of a second conductivity type diffused in the semiconductor layer deeper than the first drift layer, extending from under the first drift layer to under the gate electrode and forming a junction with the body layer under the gate electrode.

The invention achieves a lower on-resistance by modifying a high voltage MOS transistor into a DMOS transistor. The invention also overcomes the reduction of a source/drain breakdown voltage Bvds caused by the modification into the DMOS transistor by forming the first drift layer at a distance from the end of the gate electrode.

The invention also provides a semiconductor device including: a semiconductor layer of a first conductivity type; a gate electrode formed on the semiconductor layer with a gate insulation film being interposed therebetween; a source layer of a second conductivity type formed adjacent to one end of the gate electrode; a body layer of a first conductivity type extending from the source layer side to under the gate electrode; a first drift layer of a second conductivity type formed at a distance from an other end of the gate electrode; and a second drift layer of a second conductivity type diffused in the semiconductor layer deeper than the first drift layer, extending from under the first drift layer to under the gate electrode and forming a junction with the body layer under the gate electrode, wherein a recess portion is formed in a bottom portion of the second drift layer.

The invention enhances the source/drain breakdown voltage Bvds more by forming the recess portion in the bottom portion of the second drift layer in the DMOS structure where the first drift layer is formed at a distance from the end of the gate electrode. Such a high voltage MOS transistor has a high source/drain breakdown voltage Bvds of about 300V and a low on-resistance.

DETAILED DESCRIPTION OF THE INVENTION

Figure 19:
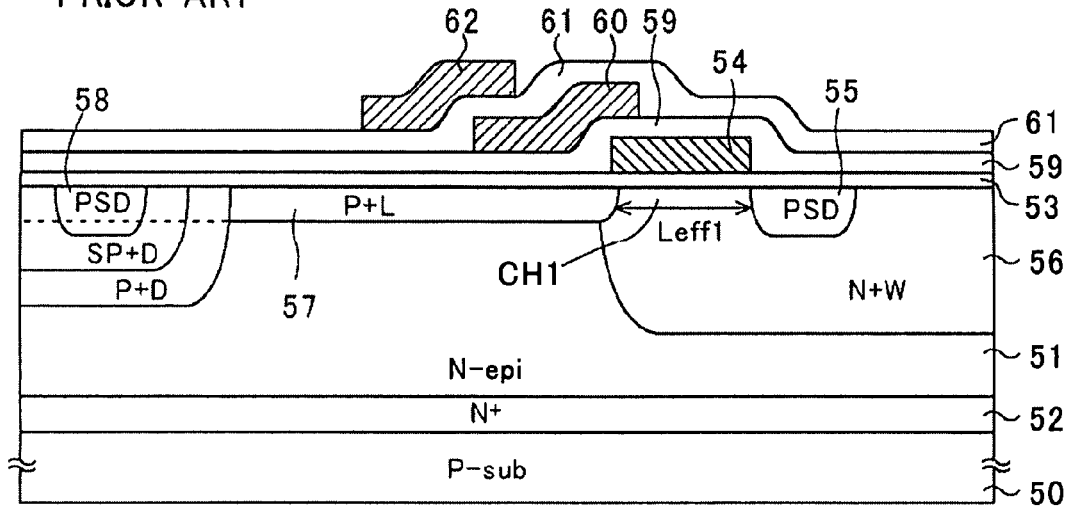
FIG. 19 is a cross-sectional view of a semiconductor device of a conventional art.
Figure 20:
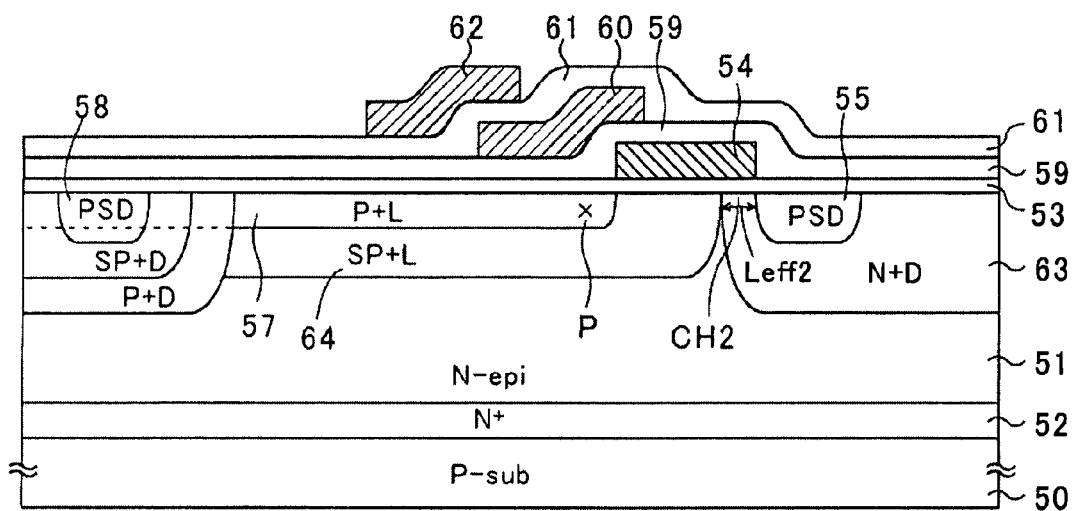
FIG. 20 is a cross-sectional view of a semiconductor device of a reference example.

A high voltage MOS transistor of a reference example in which a conventional high voltage MOS transistor (a conventional HV-PchMOS) of FIG. 19 is modified into a DMOS transistor will be described referring to FIG. 20 before the description of an embodiment of the invention. In this high voltage MOS transistor, an N-type body layer (N+D) 63 is formed extending from a source layer 55 side to under a gate electrode 54. A P-type second drift layer (SP+L) 64 is formed by being diffused in a semiconductor layer 51 deeper than a first drift layer 57, extending from under the first drift layer 57 to under the gate electrode 54 and forming a PN junction with the body layer 63 under this gate electrode 54. A surface of the body layer 63 between the second drift layer 64 and the source layer 55 serves as a channel region CH2. The length of the channel region CH2 is an effective channel length Leff2. The conductivity types $N^+$, N and $N^-$ belong to one general conductivity type. Likewise, the conductivity types $P^+$, P and $P^-$ belong to another general conductivity type.

In this DMOS structure, the effective channel length Leff2 is shorter than that of the conventional HV-PchMOS (FIG. 19) (Leff2<Leff1), and the second drift layer 64 is additionally formed deeper than the first drift layer 57, so that a drift path of carriers becomes wider to reduce an on-resistance. In an experiment, when a boron dose is increased in ion implantation for the second drift layer 64, a source/drain current Ids0 and a transconductance gm increase accordingly (see a line connecting measurement points □ in FIGS. 16 and 17 for reference). However, there is a problem that a source/drain breakdown voltage Bvds rapidly reduces when the boron dose is 2.5E+12/cm$^2$ (=2.5×10$^{12}$/cm$^2$) or more (see a line connecting measurement points □ in FIG. 18 for reference). The cause of this is a breakdown at an end portion P of the first drift layer 57 near the left end of the gate electrode 54 that is caused by electric field crowding there by increased concentration at the end portion P with the increased boron dose.

Figure 10:
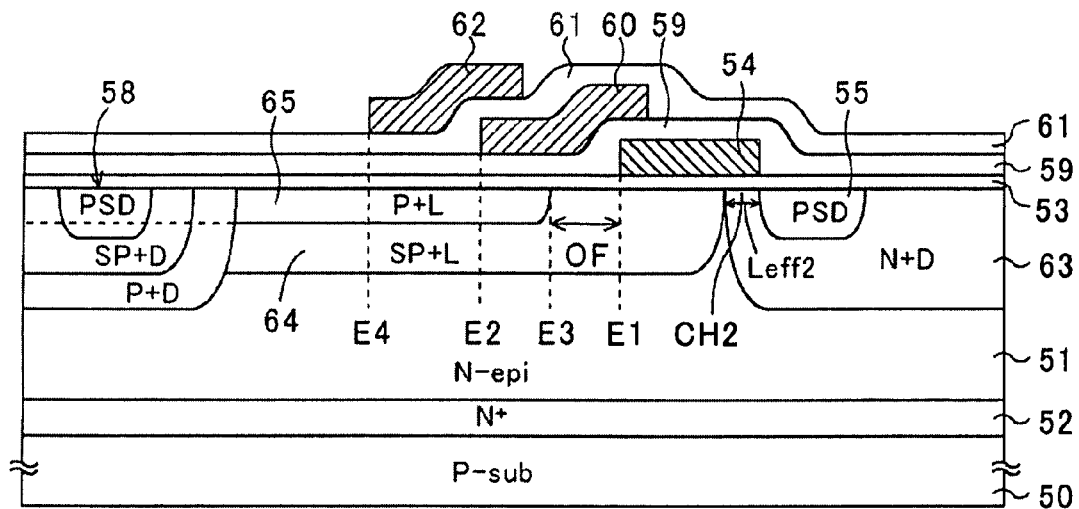

In a first embodiment of this invention, a first drift layer 65 is formed at a distance from a left end E1 of the gate electrode 54 where the electric field crowding easily occurs as shown in FIG. 10. The distance from a right end E3 of the first drift layer 65 to the left end E1 of the gate electrode 54 is an offset length OF. The right end E3 of the first drift layer 65 is preferably located between the left end E1 of the gate electrode 54 and a left end E2 of a first field plate 60. This is because the on-resistance becomes too high when the right end E3 of the first drift layer 65 is located on the left side of the left end E2 of the first field plate 60 (the offset length OF is increased). On the other hand, when the right end E3 of the first drift layer 65 is located too close to the left end E1 of the gate electrode 54 (the offset length OF is reduced), the source/drain breakdown voltage Bvds reduces.

Therefore, it is preferable to locate the right end E3 of the first drift layer 65 in a center of a region between the left end E1 of the gate electrode 54 and the left end E2 of the first field plate 60. For example, when the length from the left end E1 of the gate electrode 54 to the left end E2 of the first field plate 60 is 12 μm, the right end E3 of the first drift layer 65 is located in the center of the length and the offset length OF is 6 μm.

Figure 16:
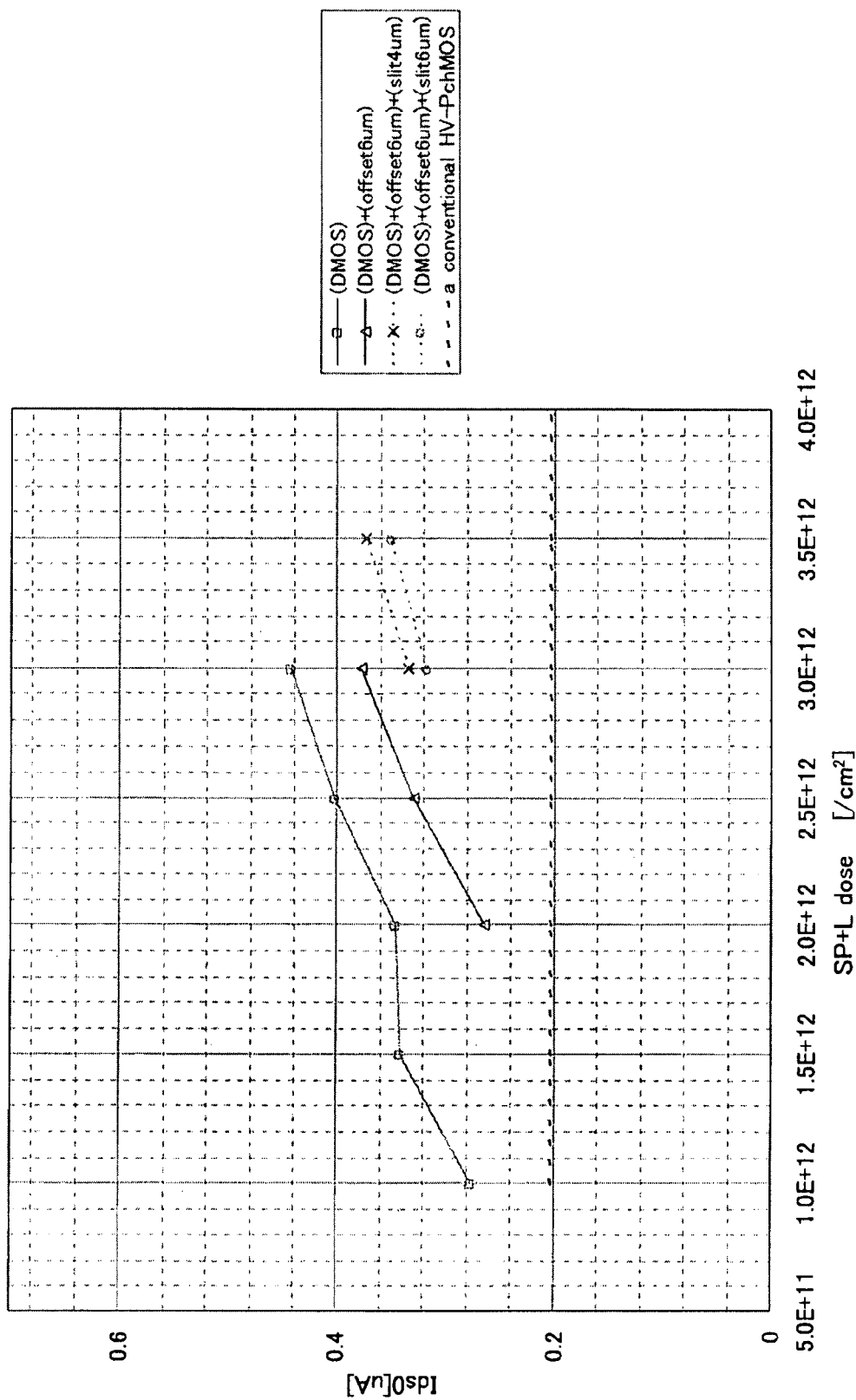
FIG. 16 is a graph showing a relation of a source/drain current Ids0 and a boron dose in ion implantation for forming a second drift layer.
Figure 17:
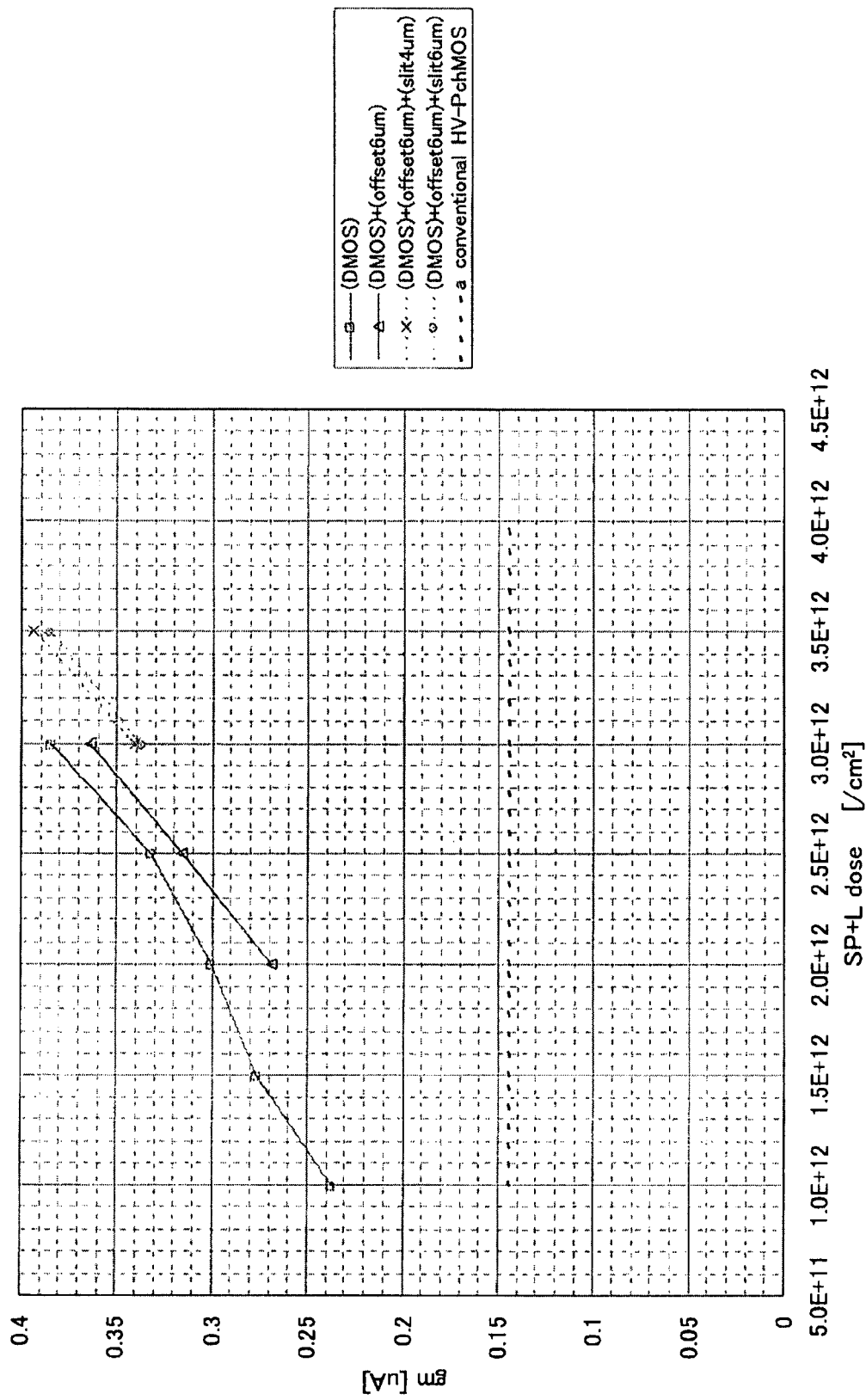
FIG. 17 is a graph showing a relation of a transconductance gm and a boron dose in ion implantation for forming the second drift layer.

With such a design, the source/drain current Ids0 and the transconductance gm are reduced, compared with the DMOS structure where the offset length OF is 0 μm (FIG. 20) (see a line connecting measurement points Δ in FIGS. 16 and 17 for reference). However, this is within the permissible range because the boron dose is increased. As long as the boron dose is 2.5E+12/cm$^2$ or less, the reduction of the source/drain breakdown voltage Bvds does not occur (see a line connecting measurement points Δ in FIG. 18 for reference).

Figure 1:
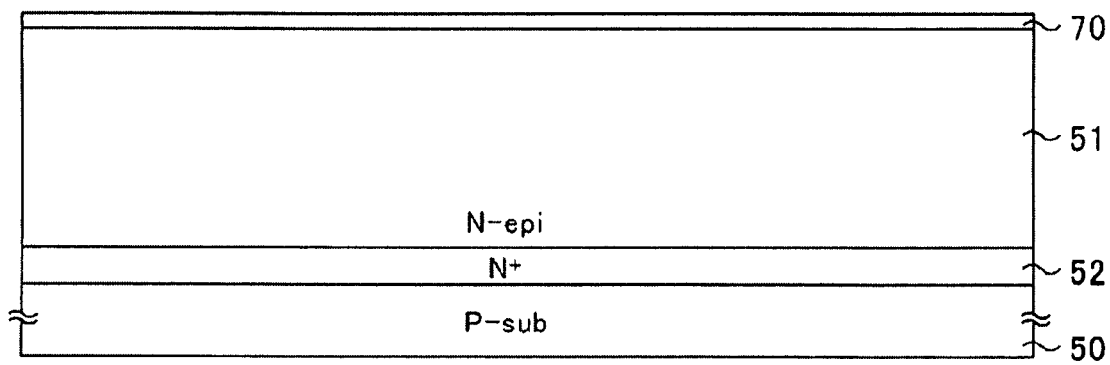
FIGS. 1 to 10 are cross-sectional views for explaining a method of manufacturing a semiconductor device of a first embodiment of the invention.

Next, a method of manufacturing the high voltage MOS transistor of this embodiment will be described referring to figures. As shown in FIG. 1, a high concentration of N-type impurities is ion-implanted in a surface of a P-type single crystal semiconductor substrate 50 (e.g. a silicon single crystal substrate), and an N-type epitaxial semiconductor layer 51 is formed on the surface by epitaxial growth. Then, an $N^+$-type embedded semiconductor layer 51 is formed at an interface of the single crystal semiconductor substrate 50 and the epitaxial semiconductor layer 51. A dummy oxide film 70 is then formed on the surface of the epitaxial semiconductor layer 51 by thermal oxidation.

Figure 2:
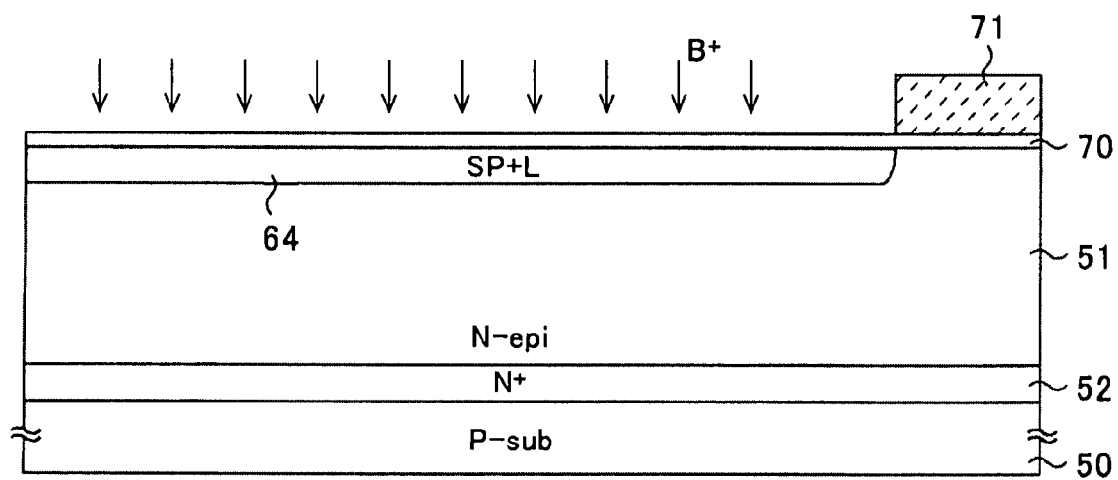
Figure 3:
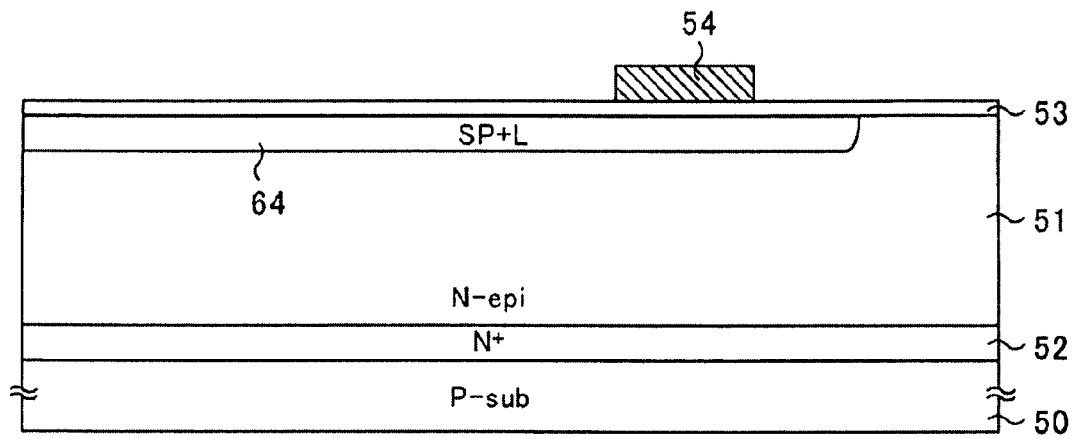

Then, as shown in FIG. 2, a photoresist layer 71 is selectively formed on the dummy oxide film 70, and a second drift layer 64 is formed in a region where the high voltage MOS transistor is to be formed by ion implantation of boron (B+) using this photoresist layer 71 as a mask. Then, after the photoresist layer 71 and the dummy oxide film 70 are removed, a gate insulation film 53 having a thickness of about 90 nm is formed by thermal oxidation, and the gate electrode 54 having a thickness of about 400 nm is formed on this gate insulation film 53 as shown in FIG. 3. The gate electrode 54 is made of polysilicon, metal silicide having a high melting point, or the like.

Figure 4:
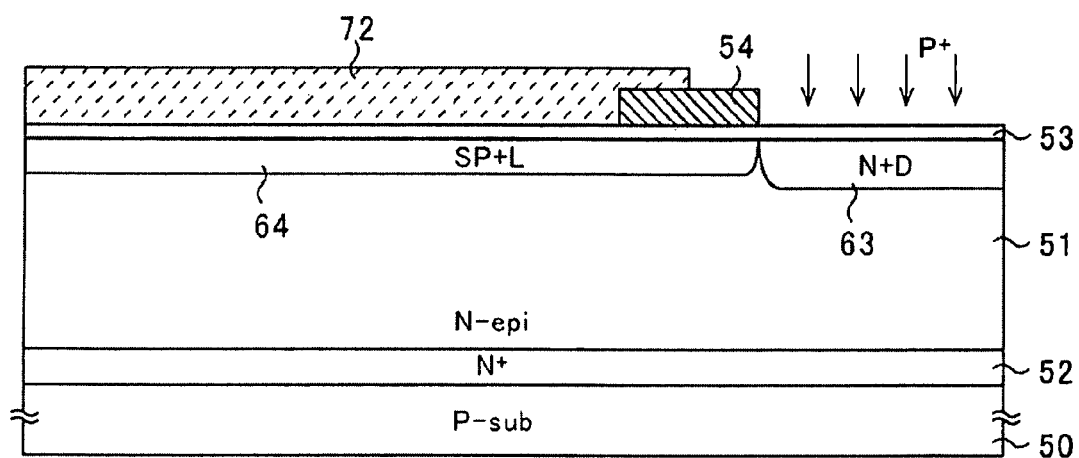
Figure 5:
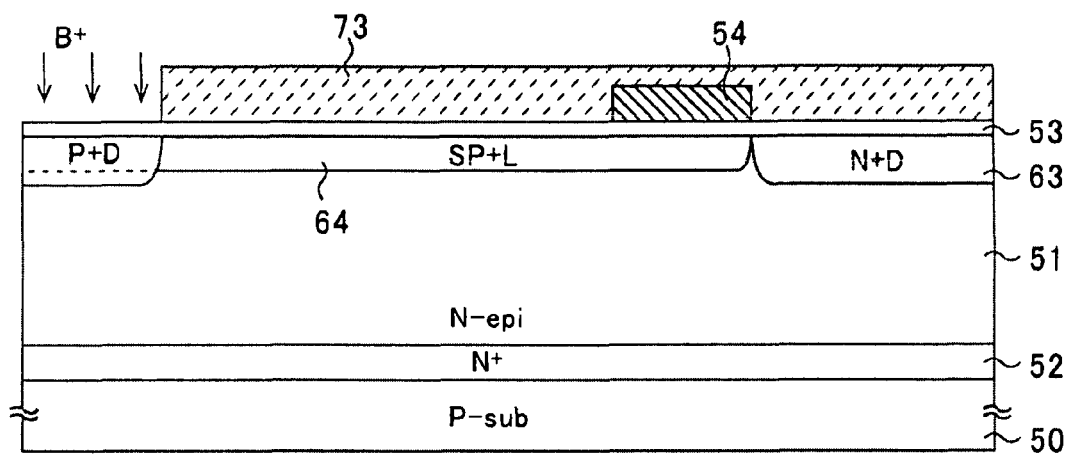

Then, as shown in FIG. 4, a photoresist layer 72 is formed from on a portion of the gate electrode 54 over the second drift layer 64 on the left side of the gate electrode 54, and an N-type body layer 63 is formed on the surface of the epitaxial semiconductor layer 51 on the right side of the gate electrode 54 by ion-implantation of phosphorus (P+) using this gate electrode 54 and the photoresist layer 72 as a mask. A phosphorus (P+) dose is about 1×10$^{13}$/cm$^2$. The second drift layer 64 on the right side of the gate electrode 54 is compensated with phosphorus (P+). Then, the photoresist layer 72 is removed, and a photoresist layer 73 is formed being provided with an opening in a region where a drain layer 58 of FIG. 10 is to be formed, as shown in FIG. 5. A P+D layer of the drain layer 58 is then formed by ion implantation of boron (B+) using this photoresist layer 73 as a mask. A boron (B+) dose is about 1×10$^{13}$/cm$^2$.

Figure 6:
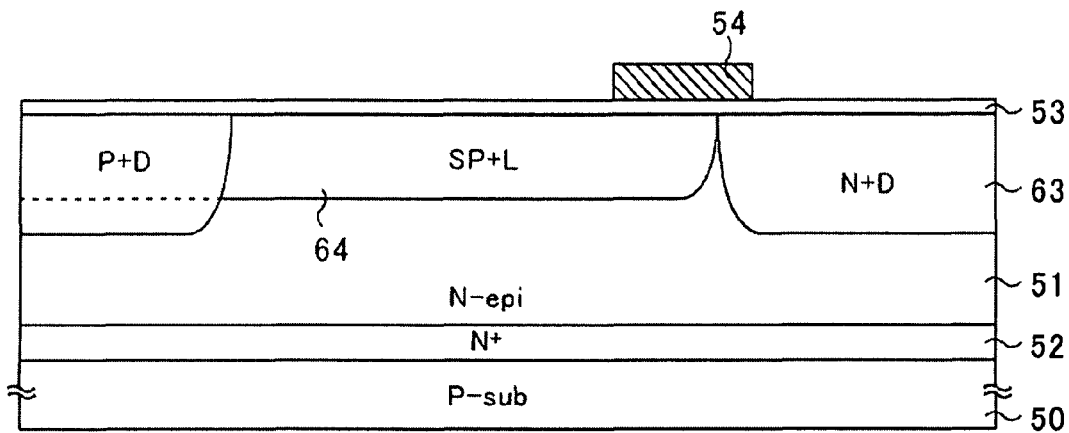
Figure 7:
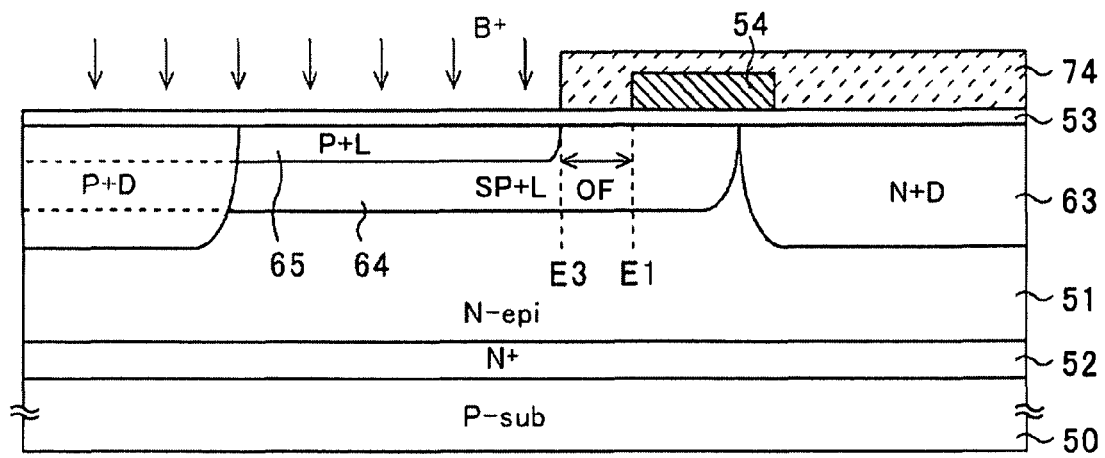
Figure 8:
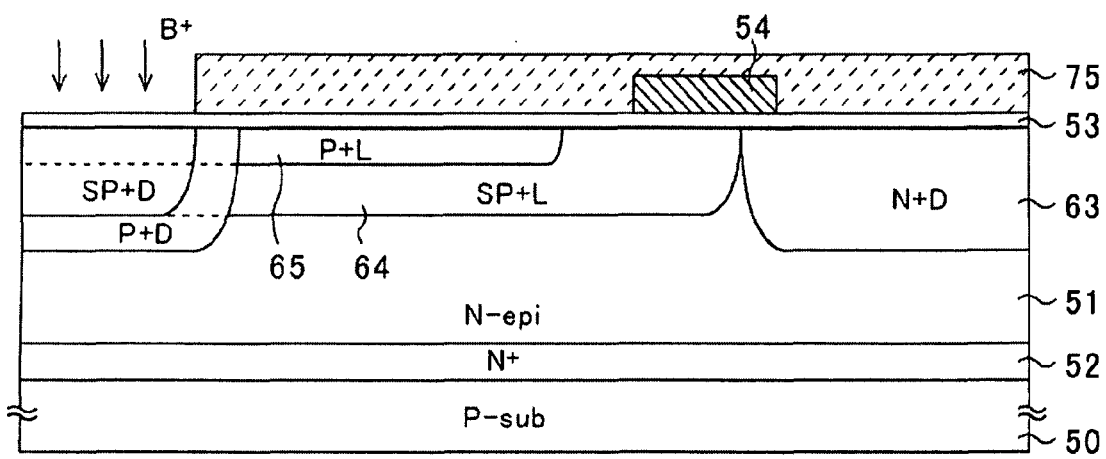

Then, as shown in FIG. 6, thermal diffusion is performed at a temperature of 1180° C. in N$_2$ atmosphere for four hours. By this process, the second drift layer 64, the body layer 63 and the P+D layer are diffused deep, and the body layer 63 and the second drift layer 64 form a PN junction under the gate electrode 54. Then, as shown in FIG. 7, a photoresist layer 74 is formed from above the body layer 63 to above a portion of the second drift layer 64 on the left side of the gate electrode 54, and the first drift layer 65 is formed by ion implantation of boron (B+) using this photoresist layer 74 as a mask. The length from the right end E3 of the first drift layer 65 to the left end E1 of the gate electrode 54 is the offset length OF. Then, after the photoresist layer 74 is removed, a photoresist layer 75 is formed and a SP+D layer is formed in the P+D layer by ion implantation of boron (B+) using this photoresist layer 75 as a mask as shown in FIG. 8. The photoresist layer 75 is then removed, and thermal diffusion is performed at a temperature of 1050° C. for five hours or 1100° C. for 90 minutes.

Figure 9:
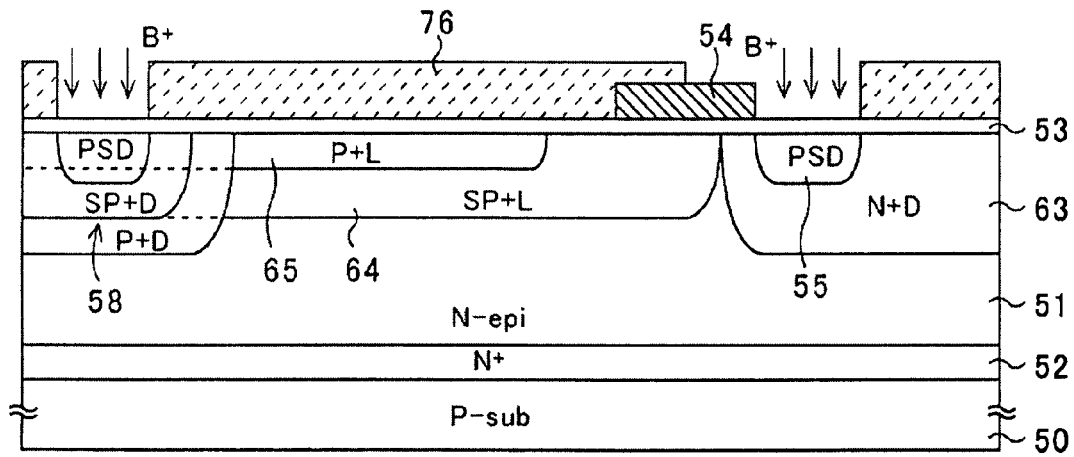

Then, as shown in FIG. 9, a photoresist layer 76 is formed, being provided with openings in regions where a PSD layer of the drain layer 58 and a source layer 55 are to be formed respectively, and the PSD layer of the drain layer 58 and the source layer 55 are formed by ion implantation of boron (B+) using this photoresist layer 76 as a mask. A boron (B+) dose is about $1 \times 10^{15}/cm^2$.

Then, as shown in FIG. 10, after the photoresist layer 76 is removed, the first field plate 60 extending from above a portion of the gate electrode 54 to above the first drift layer 65 with a first interlayer insulation film 59 being interposed therebetween and a second field plate 62 extending from above a portion of the first field plate 60 to above the first drift layer 65 with a second interlayer insulation film 61 being interposed therebetween are formed. The first and second interlayer insulation films 59 and 61 are about 1000 nm in thickness. The first and second field plates 60 and 62 are made of a conductive material such as aluminum or an aluminum alloy.

Figure 18:
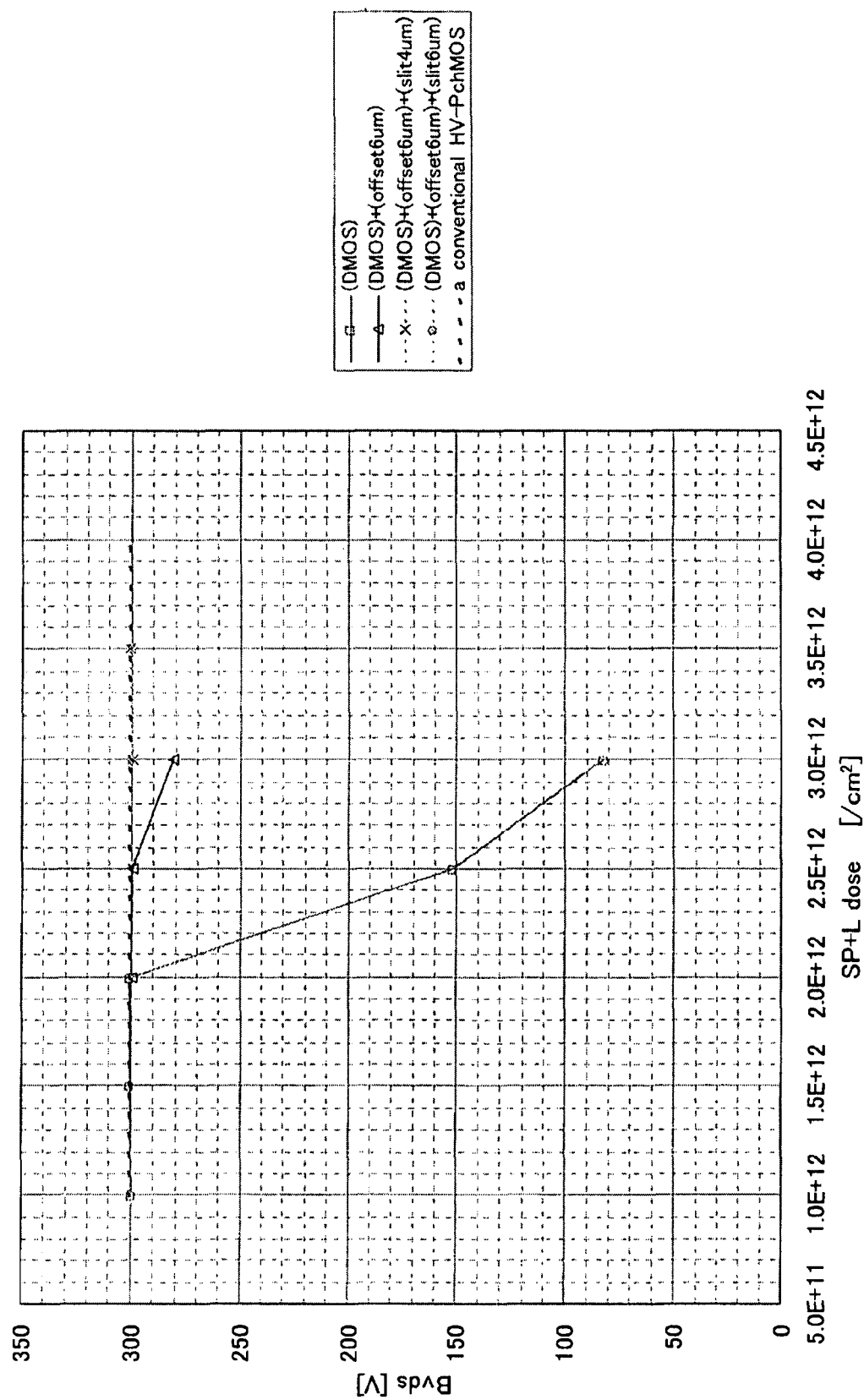
FIG. 18 is a graph showing a relation of a source/drain breakdown voltage Bvds and a boron dose in ion implantation for forming the second drift layer.

In the first embodiment, the source/drain breakdown voltage Bvds is increased by disposing the first drift layer 65 at a distance from the left end E1 of the gate electrode 54 in the DMOS structure. However, when the boron dose in ion implantation for forming the second drift layer 64 is $3.0E+12/cm^2$ ($=3.0 \times 10^{12}/cm^2$) or more, the reduction of the source/drain breakdown voltage Bvds occurs as shown in FIG. 18. It is found that the cause of this is a breakdown at the PN junction in a region between the left end E2 of the first field plate 60 and a left end E4 of the second field plate 62. In the first embodiment, the breakdown does not occur at the end of the gate electrode 54 since the first drift layer 65 is disposed at a distance from the left end E1 of the gate electrode 54. However, instead of this, the concentration of the second drift layer 64 in a region between the left end E2 of the first field plate 60 and the left end E4 of the second field plate 62 is increased and thus a depletion layer may not expand easily. This may lead to the breakdown of the PN junction.

Figure 15:
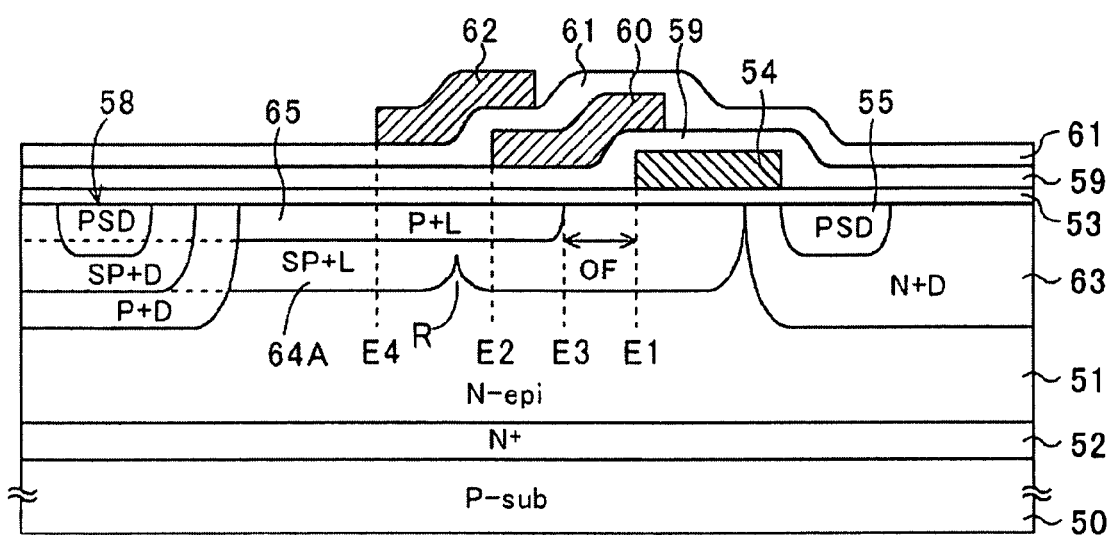

Therefore, in a second embodiment of this invention, the source/drain breakdown voltage Bvds is increased by forming a recess portion R in a bottom portion of the second drift layer 64A in a region between the left end E2 of the first field plate 60 and the left end E4 of the second field plate as shown in FIG. 15. The source/drain breakdown voltage Bvds is increased because the expansion of the depletion layer by the application of a drain voltage is increased since the concentration of P-type impurities is locally reduced at the recess portion R of the second drift layer 64A and the area of the PN junction of the recess portion R of the second drift layer 64A and the epitaxial semiconductor layer 51 is increased.

Figure 11:
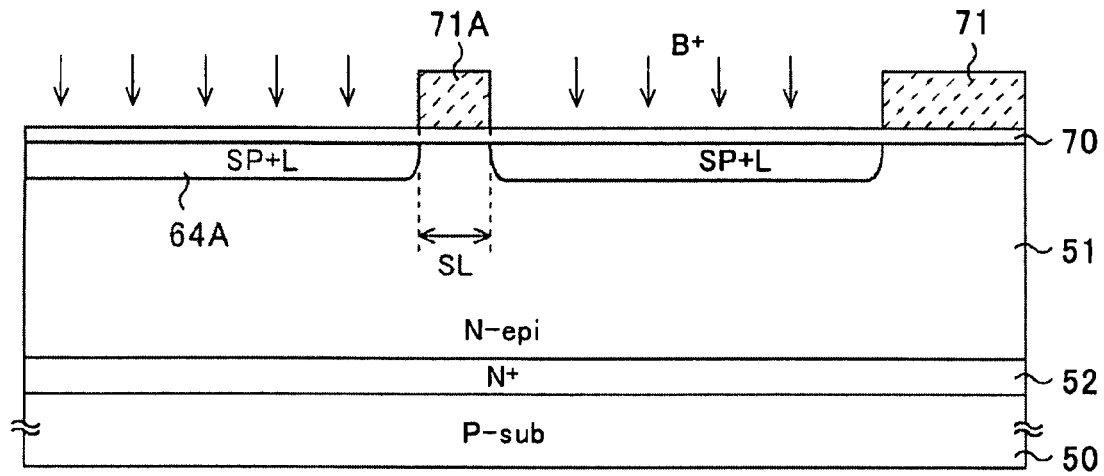
FIGS. 11 to 15 are cross-sectional views for explaining a method of manufacturing a semiconductor device of a second embodiment of the invention.
Figure 12:
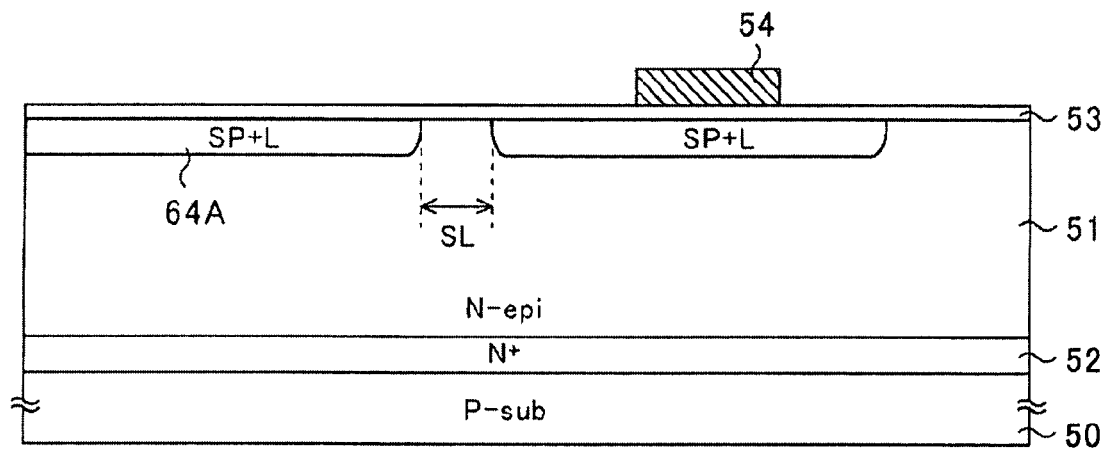
Figure 13:
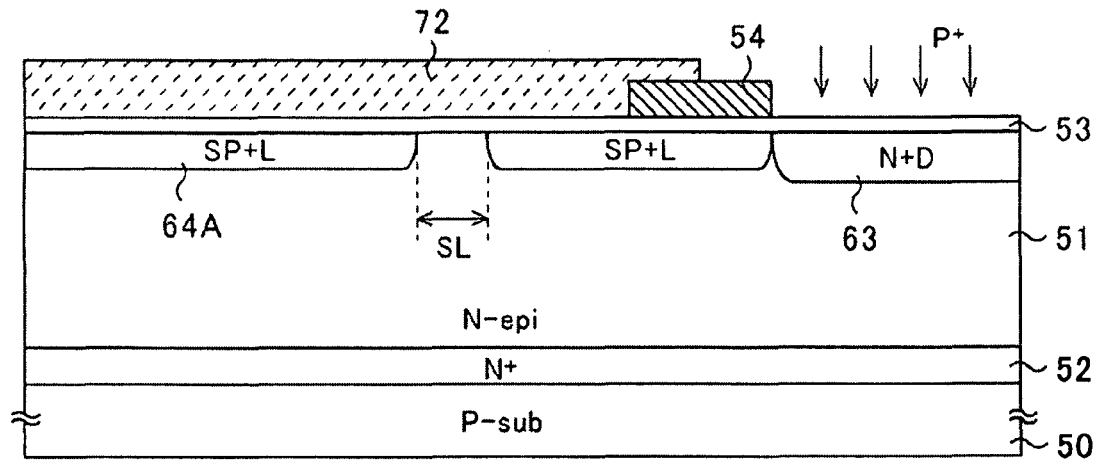
Figure 14:
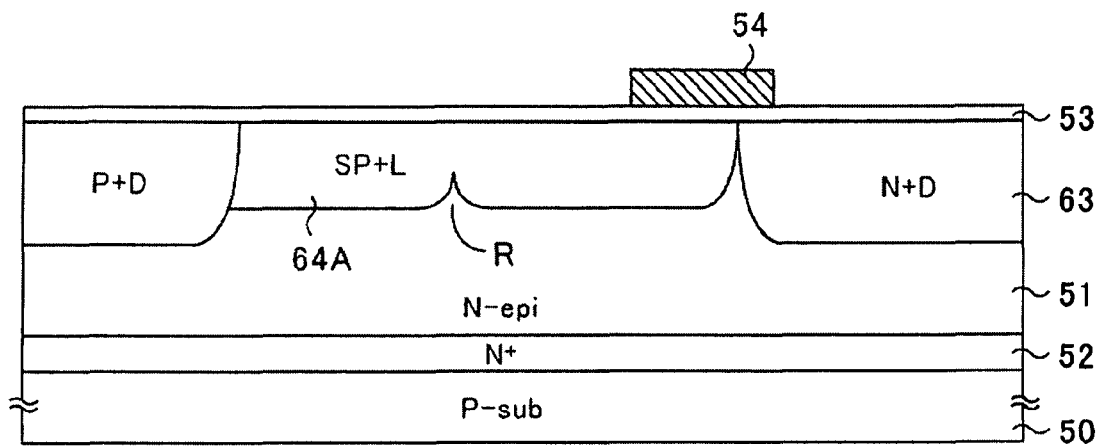

The recess portion R of the second drift layer 64A is formed in the following manner. First, as shown in FIG. 11, a photoresist piece 71A is formed when the second drift layer 64A is to be formed by ion implantation, and thus a slit SL having that photoresist width is formed under the photoresist piece 71A. After then, the same processes as in the first embodiment are performed. In detail, the gate electrode 54 is formed as shown in FIG. 12, and the body layer 63 is formed as shown in FIG. 13. Then, the P+D layer is formed, and thermal diffusion is performed at 1180° C. in $N_2$ atmosphere for four hours as described above as shown in FIG. 14. By this thermal diffusion, boron is diffused in a lateral direction to narrow the width of the slit SL, and at last the upper portion of the slit SL is filled with boron to form the recess portion R in the bottom portion of the second drift layer 64A.

In this high voltage MOS transistor, the source/drain current Ids0 and the transconductance gm are reduced compared with the first embodiment where the offset length OF is 6 μm (FIG. 10). In FIGS. 16 and 17, a measurement point × is in a case where the offset length OF is 6 μm and the length of the slit SL is 4 μm, and a measurement point ○ is in a case where the offset length OF is 6 μm and the length of the slit SL is 6 μm. The reduction of the source/drain current Ids0 and the transconductance gm are within the allowable range, and are compensated by increasing the boron dose. Furthermore, it is recognized that the reduction of the source/drain breakdown voltage Bvds does not occur as long as the boron dose is $3.5E+12/cm^2$ or less as shown in FIG. 18 (see lines connecting measurement points × and ○ in FIG. 18 for reference).

Furthermore, it is recognized that the source/drain breakdown voltage Bvds does not reduce to less than 300V as long as the recess portion R in the bottom portion of the second drift layer 64A is located in a region between the left end E2 of the first field plate 60 and the left end E4 of the second field plate.

What is claimed is:

1. A semiconductor device comprising:
    a semiconductor layer of a first general conductivity type;
    a gate insulation film disposed on the semiconductor layer;
    a gate electrode disposed on the gate insulation film;
    a field plate covering part of the gate electrode;
    a source layer of a second general conductivity type formed in the semiconductor layer adjacent one end of the gate electrode;
    a body layer of the first general conductivity type formed in the semiconductor layer and extending under the gate electrode from the source layer;
    a first drift layer of the second general conductivity type formed in the semiconductor layer so as to provide a separation between the first drift layer and the gate electrode in plan view of the semiconductor device, an end of the first drift layer being located in a center portion between an end of the gate electrode and an end of the field plate; and
    a second drift layer of the second general conductivity type formed in the semiconductor layer so as to be located under substantially all of the first drift layer, extend under the gate electrode and form a junction with the body layer under the gate electrode,
    wherein the gate insulation film, the first drift layer and the second drift layer are stacked in this order in a thickness direction of the semiconductor layer.

2. The semiconductor device of claim 1, further comprising a second field plate covering part of the first field plate and part of the first drift layer.

3. The semiconductor device of claim 2, wherein the first field plate and the second field plate are configured to be at the same potential as the source layer.

4. The semiconductor device of claim 1, further comprising a drain layer being physically in contact with the first drift layer and the second drift layer.

5. The semiconductor device of claim 1, wherein the semiconductor layer comprises an epitaxial semiconductor layer formed on a single crystal semiconductor substrate of the second general conductivity type and an embedded semiconductor layer formed between the single crystal semiconductor substrate and the epitaxial semiconductor layer.

6. The semiconductor device of claim 1, wherein the gate electrode and the body layer overlap in the plan view of the semiconductor device.

7. A semiconductor device comprising:
a semiconductor layer of a first general conductivity type;
a gate insulation film disposed on the semiconductor layer;
a gate electrode disposed on the gate insulation film;
a source layer of a second general conductivity type formed in the semiconductor layer adjacent one end of the gate electrode;
a body layer of the first general conductivity type formed in the semiconductor layer and extending under the gate electrode from the source layer;
a first drift layer of the second general conductivity type formed in the semiconductor layer so as to be separated from the gate electrode by a predetermined distance; and
a second drift layer of the second general conductivity type formed in the semiconductor layer so as to be located under the first drift layer, extend under the gate electrode and form a junction with the body layer under the gate electrode,
wherein the first drift layer is disposed between the gate insulation film and the second drift layer, a recess is formed in a bottom portion of the second drift layer between an edge of the second drift layer and the other edge of the second drift layer in a sectional view of the semiconductor device, and surfaces of the bottom portion of the second drift layer on each side of the recess are substantially collinear.

8. The semiconductor device of claim 7, further comprising a first field plate covering part of the gate electrode and part of the first drift layer and a second field plate covering part of the first field plate and part of the first drift layer, wherein the recess of the second drift layer is formed in a region between ends of the first field plate and the second field plate on the first drift layer.

9. The semiconductor device of claim 8, wherein the first field plate and the second field plate are configured to be at the same potential as the source layer.

10. The semiconductor device of claim 7, further comprising a drain layer being in contact with the first drift layer and the second drift layer.

11. The semiconductor device of claim 7, wherein the semiconductor layer comprises an epitaxial semiconductor layer formed on a single crystal semiconductor substrate of the second general conductivity type and an embedded semiconductor layer formed between the single crystal semiconductor substrate and the epitaxial semiconductor layer.

* * * * *